US009663713B2

United States Patent
Emoto

(10) Patent No.: US 9,663,713 B2
(45) Date of Patent: May 30, 2017

(54) PHOSPHOR, LIGHT-EMITTING ELEMENT AND LIGHTING DEVICE

(71) Applicant: DENKA COMPANY LIMITED, Tokyo (JP)

(72) Inventor: Hideyuki Emoto, Tokyo (JP)

(73) Assignee: DENKA COMPANY LIMITED, Tokyo (JP)

( * ) Notice: Subject to any disclaimer, the term of this patent is extended or adjusted under 35 U.S.C. 154(b) by 126 days.

(21) Appl. No.: 14/442,656

(22) PCT Filed: Oct. 30, 2013

(86) PCT No.: PCT/JP2013/079438
§ 371 (c)(1),
(2) Date: May 13, 2015

(87) PCT Pub. No.: WO2014/077132
PCT Pub. Date: May 22, 2014

(65) Prior Publication Data
US 2016/0280993 A1    Sep. 29, 2016

(30) Foreign Application Priority Data
Nov. 13, 2012    (JP) .................. 2012-248885

(51) Int. Cl.
*C09K 11/64* (2006.01)
*C09K 11/08* (2006.01)
(Continued)

(52) U.S. Cl.
CPC ...... *C09K 11/7721* (2013.01); *C09K 11/0883* (2013.01); *C09K 11/7734* (2013.01); *F21V 9/16* (2013.01); *H01L 33/502* (2013.01)

(58) Field of Classification Search
CPC ...... C09K 11/7721; F21V 9/16; H01L 33/502
See application file for complete search history.

(56) References Cited

U.S. PATENT DOCUMENTS 8,663,500 B2 * 3/2014 Emoto ............... C01B 21/0821
252/301.4
2009/0091237 A1    4/2009 Hirosaki et al.
(Continued)

FOREIGN PATENT DOCUMENTS

CN    101755030 A    6/2010
EP    1555307 A2    7/2005
(Continued)

OTHER PUBLICATIONS

Office Action issued in the corresponding Chinese Patent Application No. 201380059042.6 on Apr. 29, 2016.
(Continued)

Primary Examiner — Carol M Koslow
(74) Attorney, Agent, or Firm — Birch, Stewart, Kolasch & Birch, LLP

(57) ABSTRACT

Provided is a Li-solid-solubilized α-SiAlON phosphor containing $Li^+$ solid-solubilized for stabilization of the structure which is higher in luminous efficiency than any phosphor currently available and a light-emitting element and a lighting device comprising the same. An Eu-activated Li-solid-solubilized α-SiAlON, having a lattice constant a of 0.7820 to 0.7835 nm, a lattice constant c of 0.5645 to 0.5670 nm, an oxygen content of 0.4 to 1.2 mass %, and an europium (Eu) content of 0.3 to 1.2 mass %, and emitting a light having a peak wavelength of 580 to 595 nm in the fluorescence spectrum obtained when it is excited by a monochromatic light having a peak wavelength in the range of 450 to 460 nm.

6 Claims, 1 Drawing Sheet

(51) Int. Cl.
*F21S 2/00* (2016.01)
*F21V 3/00* (2015.01)
*F21V 3/04* (2006.01)
*F21V 9/16* (2006.01)
*H01L 33/50* (2010.01)
*C09K 11/77* (2006.01)

(56) References Cited

U.S. PATENT DOCUMENTS

| | | |
|---|---|---|
| 2010/0164367 A1 | 7/2010 | Shioi et al. |
| 2011/0133629 A1 | 6/2011 | Sakata et al. |
| 2012/0319566 A1* | 12/2012 | Sakata ............... C09K 11/0883 313/503 |
| 2014/0197362 A1 | 7/2014 | Sakata et al. |
| 2015/0083966 A1 | 3/2015 | Hirosaki et al. |

FOREIGN PATENT DOCUMENTS

| | | |
|---|---|---|
| EP | 2036966 A1 | 3/2009 |
| JP | 2002-363554 A | 12/2002 |
| JP | 2010-202738 A | 9/2010 |
| JP | 2010-241995 A | 10/2010 |
| TW | 200730605 | 6/1995 |
| WO | WO 2007/004493 A1 | 1/2007 |
| WO | WO 2010/018873 A1 | 2/2010 |
| WO | WO 2010/087348 * | 8/2010 |
| WO | WO 2011/108740 * | 9/2011 |
| WO | WO 2011/108740 A1 | 9/2011 |
| WO | 2012/046288 A1 | 4/2012 |

OTHER PUBLICATIONS

Extended European Search Report, dated May 18, 2016, for European Application No. 13855350.8.
Extended European Search Report, dated May 18, 2016, for European Application No. 13854407.7.

* cited by examiner

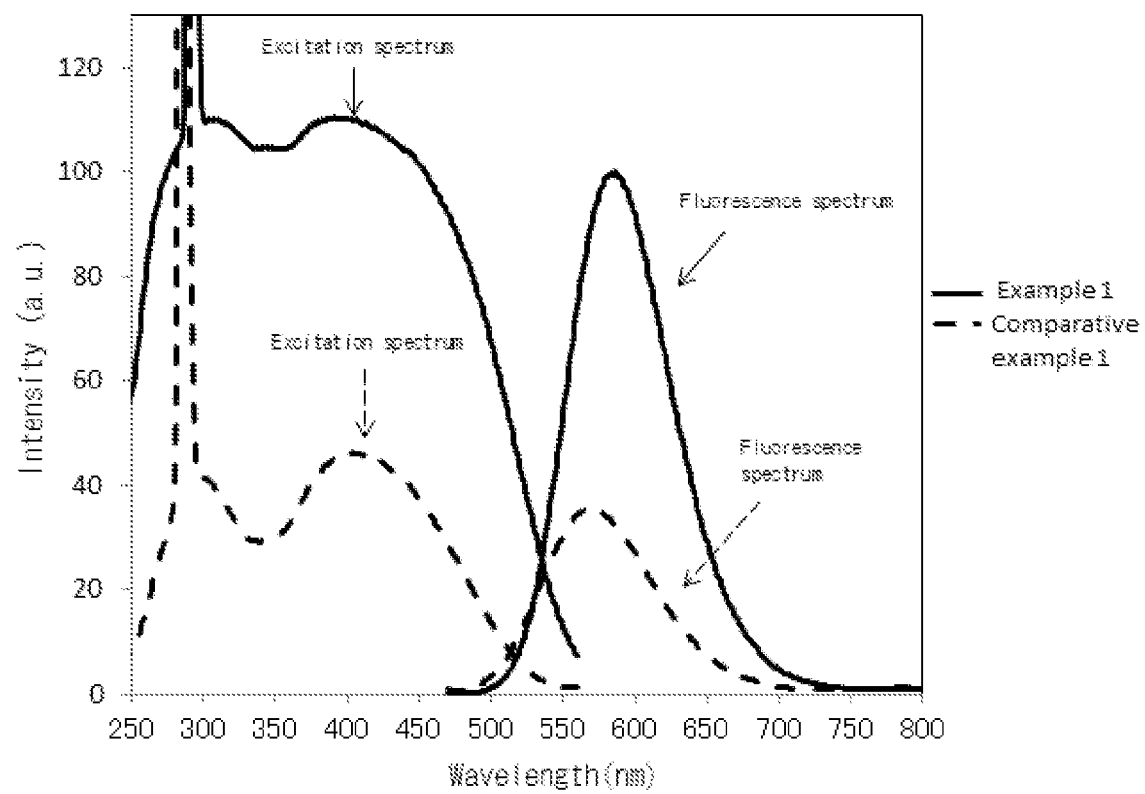

PHOSPHOR, LIGHT-EMITTING ELEMENT AND LIGHTING DEVICE

TECHNICAL FIELD

The present invention relates to a phosphor and also a light-emitting element and a lighting device comprising the phosphor. More specifically, it relates to a phosphor, a light-emitting element, and a lighting device that emit orange light, as excited by ultraviolet to blue light.

BACKGROUND ART

SiAlONs are grouped into α-SiAlONs and β-SiAlONs. α-SiAlONs, oxynitride materials represented by General Formula: $Si_{12-(m+n)}Al_{(m+n)}O_nN_{16-n}$, give a phosphor when they are solid-solubilized with a rare earth element and the structure is stabilized when they contain a solid-solubilized metal element. Examples of the metal elements traditionally solid-solubilized for stabilization of the structure of the phosphor's host crystal include Li, Ca, Mg, Y, and the like (see Patent Documents 1 to 4).

Patent Document 1 discloses a Ca-solid-solubilized α-SiAlON phosphor represented by General Formula: $Ca_{x-}Eu_ySi_{12-(m+n)}Al_{(m+n)}O_nN_{16-n}$ (wherein, x and y each are a value of more than 0 and less than 2; x+y is a value of more than 0 and 2 or less; m is 2(x+y) and n is a value of 0.5 or more and 2 or less). As described for the phosphor described in Patent Document 1, it is possible to make the stable structure in a wide compositional range and obtain high luminous efficiency when $Ca^{2+}$ is used as the metal ion for stabilization of the structure. In contrast, Patent Documents 2 to 4 disclose Li-solid-solubilized α-SiAlON phosphors containing $Li^+$ as the metal ion for stabilization of the structure.

CITATION LIST

Patent Literatures

[Patent Document 1] JP-A No. 2002-363554
[Patent Document 2] WO No. 2007/004493
[Patent Document 3] WO No. 2010/018873
[Patent Document 4] JP-A No. 2010-202738

SUMMARY OF INVENTION

Technical Problem

Eu-activated Ca-solid-solubilized α-SiAlON phosphors such as those described in Patent Document 1 show the highest luminous efficiency when they emit orange light. On the other hand, Li-solid-solubilized α-SiAlON phosphors such as those described in Patent Documents 2 to 4 emits a light having a fluorescence spectrum blueshifted (i.e., shifted toward shorter wavelength), compared to the Ca-solid-solubilized α-SiAlON phosphors, but have a problem that the fluorescence intensity declines with the blueshift.

Accordingly, an object of the present invention is to provide a Li-solid-solubilized α-SiAlON phosphor containing $Li^+$ as solid solubilized for stabilization of the structure that is higher in luminous efficiency than any phosphor currently available, and a light-emitting element and a lighting device comprising the same.

Solution to Problem

The inventors have studied intensively the relationship between the composition and the luminous efficiency of Li-solid-solubilized α-SiAlON phosphors wherein $Li^+$, which was used traditionally for blueshift of the emission light, was used for stabilization of the structure and found that a Li-solid-solubilized α-SiAlON phosphor has an extremely high luminous efficiency when it has a composition in a particular range permitting emission not of yellow light but of a longer-wavelength orange light and made the present invention.

The phosphor according to the present invention is an Eu-activated Li-solid-solubilized α-SiAlON having a lattice constant a of 0.7820 to 0.7835 nm, a lattice constant c of 0.5645 to 0.5670 nm, an oxygen content of 0.4 to 1.2 mass %, and an europium (Eu) content of 0.3 to 1.2 mass %, and emits a light having a peak wavelength of 580 to 595 nm in the fluorescence spectrum when excited with a monochromatic light having a peak wavelength in the range of 450 to 460 nm.

The "peak wavelength," as used herein, is the wavelength having the largest light intensity.

Part of Li in the phosphor according to the present invention is preferably replaced with one or more elements selected from the group consisting of Mg, Ca, Y, and lanthanoids (however, excluding La, Ce, and Eu), while the electrical neutrality of the phosphor is preserved.

The content of the α-SiAlON crystal in the entire crystalline phase of the phosphor according to the present invention is preferably 90 mass % or more.

The light-emitting element according to the present invention comprises the phosphor described above and a light source irradiating excitation light to the phosphor.

The light source is preferably a light-emitting diode or a laser diode having a peak emission wavelength of 240 to 480 nm.

The lighting apparatus according to the present invention comprises the light-emitting element described above.

Effects of Invention

It is possible according to the present invention to obtain an Eu-activated Li-solid-solubilized α-SiAlON with a high luminous efficiency that was not possible hitherto, as the lattice constants thereof and also oxygen and europium contents are thus specified.

BRIEF DESCRIPTION OF DRAWINGS

FIG. 1 is a graph showing the excitation light spectra and the fluorescence spectra of the phosphors of Example 1 and Comparative Example 1, wherein the wavelength is plotted on the abscissa and the relative light intensity on the ordinate.

DESCRIPTION OF EMBODIMENTS

Hereinafter, favorable embodiments of the invention will be described in detail with reference to the attached drawing.
(First Embodiment)

The phosphor according to the first embodiment of the present invention is an Eu-activated Li-solid-solubilized α-SiAlON having a lattice constant a of 0.7820 to 0.7835 nm, a lattice constant c of 0.5645 to 0.5670 nm, an oxygen content of 0.4 to 1.2 mass %, and an europium (Eu) content of 0.3 to 1.2 mass % or less. The phosphor in the present embodiment has a peak wavelength of 580 to 595 nm in the fluorescence spectrum when excited with a monochromatic light having a peak wavelength of 450 to 460 nm.

[Composition]

The Eu-activated Li-solid-solubilized α-SiAlON of the phosphor in the present embodiment is represented by General Formula: $Li_xEu_ySi_{12-(m+n)}Al_{m+n}O_nN_{16-n}$. In the formula above, x and y each are a value of more than 0 and less than 2; x+y is a value of more than 0 and 2 or less; m is x+2y; and n is a value of 0.5 or more and 2 or less.

[Solid-Solubilized Metal Element]

In the phosphor in the present embodiment, $Li^+$ is used as the metal ion for stabilization of the structure, not for traditional blueshift of the spectrum, but for preparation of a phosphor having a fluorescence intensity higher than that when $Ca^{2+}$ is solid-solubilized, as the composition of the phosphor is adjusted in a particular range.

In the phosphor of the present embodiment, Li in the General Formula above may be replaced partially with one or more elements selected from the group consisting of Mg, Ca, Y, and lanthanoids (however, excluding La, Ce, and Eu) for fine adjustment of the fluorescence properties, while the electrical neutrality of the phosphor is preserved.

[Lattice Constant]

In the phosphor in the present embodiment, the lattice constant a of the α-SiAlON was restricted to the range of 0.7820 to 0.7835 nm and the lattice constant c to the range of 0.5645 to 0.5670 nm, because of the following reason.

The composition of the α-SiAlON is defined by m and n of the General Formula. An α-SiAlON is a modified α-silicon nitride crystal in which part of the Si—N bonds are replaced with Al—N bonds and Al—O bonds, and Li and Eu are introduced, as solid-solubilized, into the opening of the crystal for preservation of electrical neutrality. m and n respectively represent the numbers of the Al—N and Al—O bonds substituted in a unit cell.

However, microscopically α-SiAlON has fluctuation in composition among particles (crystals) and macroscopically it contains heterogeneous phases (crystalline and amorphous phases) generated and also oxide layers formed on particle boundary and surface. Thus, the composition in the bulk state does not always represent the solid-solution composition of the α-SiAlON crystal emitting fluorescent light. For a similar reason, the blending composition of the α-SiAlON is different from the composition of the α-SiAlON actually obtained.

α-SiAlON has the crystal structure identical with that of α-silicon nitride. The α-silicon nitride crystal has a hexagonal crystalline system and its space group is P63/m. As the Si—N bonds of α-silicon nitride are replaced with Al—N and Al—O bonds respectively having larger bond lengths, as they are solid-solubilized, in α-SiAlON, the lattice constants along three axes a, b, and c increase as the amount of solid solution increases. The lattice constant along axis a is identical with that along axis b. As the length of Al—N bond is larger than that of Al—O bond, the lattice constant changes differently, as the values of m and n fluctuate. It is thus possible to restrict the composition range of the α-SiAlON strictly by the crystal lattice constants.

It is not possible to obtain an α-SiAlON having an excessively large lattice constant a, specifically having a lattice constant a of more than 0.7835 nm, because of the maximum solid solubility of Li. On the other hand, an α-SiAlON having an excessively small lattice constant a, specifically having a lattice constant a of less than 0.7820 nm, and that having an excessively small or excessively large lattice constant c, specifically having a lattice constant c of less than 0.5645 nm or more than 5670 nm have a significantly smaller fluorescence intensity. The lattice constant, as used herein, is a value determined by X-ray diffractometry.

An α-SiAlON having a lattice constant a of 0.7820 to 0.7835 nm and a lattice constant c of 0.5645 to 0.5670 nm gives a phosphor having a high fluorescence peak intensity.

[Oxygen Content: 0.4 to 1.3 Mass %]

In an Eu-activated Li-solid-solubilized α-SiAlON having an excessively small oxygen content, specifically having an oxygen content of less than 0.4 mass %, crystal grains grow less effectively in the production process, prohibiting production of it with high fluorescence intensity. On the other hand, an Eu-activated Li-solid-solubilized α-SiAlON having an excessively large oxygen content, specifically having an oxygen content of more than 1.3 mass %, has a lattice constant of the α-SiAlON outside the particular range described above. Thus, the Eu-activated Li-solid-solubilized α-SiAlON has an oxygen content of 0.4 to 1.3 mass %.

[Europium (Eu) Content: 0.3 to 1.2 Mass %]

An Eu-activated Li-solid-solubilized α-SiAlON having an excessively small Eu content, specifically having an Eu content of less than 0.3 mass %, does not have sufficiently high fluorescence intensity. On the other hand, an Eu-activated Li-solid-solubilized α-SiAlON having an excessively large Eu content, specifically having an Eu content of more than 1.2 mass %, shows low fluorescence intensity by concentration quenching of fluorescence by energy transfer between Eu atoms. Thus, the Eu-activated Li-solid-solubilized α-SiAlON has an Eu content of 0.3 to 1.2 mass %.

[Peak Wavelength]

The peak wavelength of an α-SiAlON phosphor in its fluorescence spectrum may change by excitation wavelength. The inventors have found that it is possible to obtain high fluorescence intensity when a blue light-emitting diode (blue LED), which is most frequently used as excitation light source, is used and when the peak wavelength in the fluorescence spectrum is in the range of 580 to 595 nm. In other words, when excited by a monochromatic light having a peak wavelength of 450 to 460 nm, if the peak wavelength obtained is less than 580 nm or more than 595 nm in the fluorescence spectrum, the phosphor has a decreased fluorescence intensity.

[Crystalline Phase]

The crystalline phase present in the phosphor of the present embodiment is not limited to α-SiAlON single phase and may contain other crystalline phases of β-silicon nitride, aluminum nitride, silicon lithium nitride, and the solid solutions thereof, if the fluorescence properties are not affected. However, for improvement of fluorescence intensity, the content of the α-SiAlON crystal in the phosphor is preferably 90 mass % or more.

As described above in detail, the phosphor in the present embodiment, i.e., an Eu-activated Li-solid-solubilized α-SiAlON having a specified lattice constant a, lattice constant c, oxygen content, and Eu content and emitting a light having a peak wavelength in a specified range of the fluorescence spectrum, when excited by a monochromatic light having a peak wavelength in the range of 450 to 460 nm, can emit orange light at a high luminous efficiency that was not possible hitherto. The phosphor in the present embodiment can be used favorably as a phosphor excited by an ultraviolet or blue light.

(Second Embodiment)

The light-emitting element in the second embodiment of the present invention comprises a phosphor and a light source and the phosphor used therein is the phosphor described above in the first embodiment. The light source used for irradiation of excitation light to the phosphor may be, for example, a light source emitting a highest-intensity light, as it has a peak wavelength in the range of 240 to 480 nm. It is particularly preferable to use a LED and LD (Laser Diode) having a peak emission wavelength in the range described above. The light-emitting element in the present embodiment, which comprises the above-described phosphor of the first embodiment, has a luminous efficiency better than before and shows favorable emission properties.

(Third Embodiment)

The lighting apparatus in the third embodiment of the present invention is a lighting apparatus comprising the above-described light-emitting element in the second embodiment. The lighting apparatus in the present embodiment shows a luminous efficiency better than before and, as it comprises a light-emitting element superior in emission characteristics, is superior in light intensity and gives favorable optical properties.

EXAMPLES

Hereinafter, effects of the present invention will be described with reference to Tables and a Figure, as Examples and Comparative Examples are compared.

Example 1

The method of producing the phosphor of Example 1 will be described below. The phosphor of Example 1 was prepared in the raw material-mixing step, the calcining step, and the acid-treating step shown below.

<Mixing Step>

Raw materials used were silicon nitride powder (E10 grade produced by Ube Industries, Ltd.), aluminum nitride powder (F grade produced by Tokuyama Corporation), europium oxide (RU grade produced by Shin-Etsu Chemical Co., Ltd.), and lithium nitride powder (produced by Materion Corporation, purity: 99.5%, 60 mesh).

Silicon nitride, aluminum nitride, and europium oxide above were weighed respectively in amounts of 84.5 mass %, 14.8 mass %, and 0.64 mass %. These ingredients were mixed wet with a silicon nitride pot and balls in ethanol solvent for 1 hour and the slurry obtained was suction-filtered for removal of the solvent and then dried. The agglomerate obtained after drying was pulverized in a mortar to give a preliminary powder mixture. In a glove box under nitrogen environment, the preliminary powder mixture and the lithium nitride powder were mixed in a mortar, to give a raw powder mixture. The mixing rate, the preliminary powder mixture:lithium nitride powder, was 94.1:5.9 by mass ratio.

<Calcining Step>

The raw powder mixture obtained in the mixing step was filled into a boron nitride crucible placed in a glove box similar to that used in the mixing step and calcined in a carbon-heater electric furnace under a temperature condition of 1800° C. for 8 hours and under a pressure at a gauge pressure of 0.7 MPa in nitrogen environment, to give an Eu-activated Li-solid-solubilized α-SiAlON powder. All of the Eu-activated Li-solid-solubilized α-SiAlON powder was forced to pass through a sieve having an opening of 150 μm for classification in size and only the powder passing additionally a sieve having an opening of 45 μm was collected.

<Acid Treatment>

The Eu-activated Li-solid-solubilized α-SiAlON powder collected was washed with a mixed solution of hydrofluoric acid and nitric acid (liquid temperature: 80° C.), to give a phosphor of Example 1 (Eu-activated Li-solid-solubilized α-SiAlON).

The composition, i.e., Li:Eu:Si:Al:O:N, of the Eu-activated Li-solid-solubilized α-SiAlON prepared by the method described above was 6.09:0.08:34.87:6.32:0.93:51.70 by atomic ratio (atom %). On the other hand, the composition (excluding impurity oxygen present in the raw nitride material), i.e., Li:Eu:Si:Al:O:N, as determined from the raw materials blended, was 9.52:0.06:31.88:6.38:0.10:52.06 by atomic ratio (atom %), which was significantly different form the composition of the final product. It is probably caused by the influences of impurity oxygen, vaporization in the heat-treating process, or solubilization and removal of heterogeneous-phase components by acid washing.

The phosphor of Example 1 is an Eu-activated Li-solid-solubilized α-SiAlON and the lattice constant a, the lattice constant c, the α-SiAlON crystal content, the oxygen content, the europium (Eu) content, and the peak wavelength and the fluorescence intensity in the fluorescence spectrum of the light obtained when it is excited by a monochromatic light having a peak wavelength of 455 nm were determined by the methods described below.

<Lattice Constants and α-SiAlON Content>

First, the crystalline phase was determined by powder X-ray diffractometry (XRD), using CuKα X-ray on an X-ray diffractometer (Ultima IV produced by Rigaku Corporation). As a result, the crystalline phase present in the phosphor of Example 1 was found to be α-SiAlON single phase (α-SiAlON crystal content: 100 mass %).

Then, the X-ray diffraction pattern obtained was subjected to Rietveld analysis using a crystal-structure-analysis software (JADE produced by Rigaku Corporation) for accurate determination of the lattice constants of the α-SiAlON. As a result, the lattice constant a of the phosphor of Example 1 was found to be 0.7829 nm and the lattice constant c to be 0.5658 nm.

<Oxygen and Europium (Eu) Contents>

The oxygen and Eu contents were determined on an oxygen nitrogen analyzer (EMGA-920 manufactured by Horiba, Ltd.) As a result, the oxygen content of the phosphor of Example 1 was found to be 0.74 mass % and the Eu content to be 0.63 mass %.

<Peak Wavelength>

The excitation and fluorescence spectra of the phosphor of Example 1 were determined on a fluorospectrophotometer (F7000 manufactured by Hitachi High-Technologies Corporation). The fluorescence spectrum was obtained under the condition of an excitation wavelength of 455 nm. The excitation spectrum was determined, as the peak wavelength in the 455 nm-excited fluorescence spectrum was used as the emission-monitoring wavelength.

FIG. 1 is a graph showing the excitation spectra and the fluorescence spectra of the phosphors of Example 1 and Comparative Example 1, as the wavelength is plotted on the abscissa and the relative light intensity on the ordinate. As shown in FIG. 1, the phosphor of Example 1 gave a broad fluorescence spectrum having a peak wavelength of 582 nm and a half value width of 82 nm. The excitation spectrum shown in FIG. 1 shows that the phosphor of Example 1 can be excited by a light having a wavelength in a wide wavelength region including the UV to visible region, particularly efficiently by a light having a wavelength of 380 to 470 nm. As described above, the phosphor of Example 1 was found to be suited for luminescent devices that comprise a near-ultraviolet to blue LED as the excitation light source.

<Fluorescence Intensity>

The light intensity, which varies according to the analyzer and the condition employed, has an arbitrary unit and thus, the light intensities of the phosphors of Examples and Comparative Examples at the peak wavelength determined under the same condition were compared with each other. As for the evaluation criteria, a sample having a relative fluorescence peak intensity of 80% or more, as compared to 100% of the fluorescence peak intensity of Example 1, was considered satisfactory.

Comparative Example 1

The phosphor of Comparative Example 1 was prepared and evaluated in a manner similar to the method and the condition of Example 1, except that lithium carbonate powder (produced by Wako Pure Chemical Industries, Ltd., special grade reagent) was used as the lithium source, aluminum nitride powder (F grade produced by Tokuyama Corporation) and aluminum oxide powder (TM-DAR grade produced by Taimei Chemicals Co., Ltd.) were used as the aluminum source; and the blending rate of the raw materials, i.e., silicon nitride:aluminum nitride:aluminum oxide:europium oxide:lithium carbonate, was changed to 74.42:12.57:5.72:0.59:6.70 by mass ratio (mass %).

Consequently as shown in FIG. 1, the phosphor of Comparative Example 1 gave a peak wavelength of 565 nm in the fluorescence spectrum and a relative fluorescence peak intensity of 36%, when excited by a light having a wavelength of 455 nm.

Examples 2 to 6 and Comparative Examples 2 to 4

A powder mixture obtained by mixing the raw powders used in Example 1 and Comparative Example 1 at a different blending rate was processed in a manner similar to the method and condition of Example 1, to give each of the phosphors of Examples 2 to 6 and Comparative Examples 2 to 4. These phosphors were used for evaluation. Powder X-ray diffraction analysis showed that the phosphors of Examples 2 to 6 and 8 and Comparative Example 2 and 4 contained heterogeneous phases of $LiSi_2N_3$ and $LiAlSi_2N_4$ in addition to α-SiAlON. The phosphors containing multiple crystalline phases detected were subjected to Rietveld analysis for determination of the contents of respective components and thus, the α-SiAlON content was calculated.

Example 7

Calcium nitride powder (produced by Materion Corporation, purity: 99.5%, 200 mesh) was used as the calcium source and the calcium nitride powder was blended in an amount corresponding to the amount at which 20 mass % of Li in the phosphor of Example 1 is replaced with Ca. The difference in cationic valency between Li and Ca was compensated by adjustment of the Al amount (α-SiAlON solid solubilization parameter: m). The powder mixture blended in this way was treated in a manner similar to the method and condition of Example 1, to give a phosphor of Example 7.

Powder X-ray diffraction analysis showed that the crystalline phase present in the phosphor of Example 7 was α-SiAlON single phase, having a lattice constant a of 0.7834 nm, a lattice constant c of 0.5666 nm, an oxygen content of 0.68 mass %, and an Eu content of 0.65 mass %. The phosphor of Example 7 had a peak wavelength of 587 nm and a relative fluorescence peak intensity of 95% in the fluorescence spectrum, when excited by a light having a wavelength of 455 nm. The phosphor of Example 7 showed red shift (toward longer wavelength) of the fluorescence peak wavelength, while retaining the high peak intensity of the phosphor of Example 1.

Example 8

The phosphor of Example 8 was prepared and evaluated in a manner similar to the method and condition of Example 1, except that the acid washing after incineration was carried out at room temperature. Powder X-ray diffraction analysis of the phosphor of Example 8 showed the presence of heterogeneous phases of $LiSi_2N_3$ and $LiAlSi_2N_4$ in addition to α-SiAlON.

Rietveld analysis of the phosphor showed that the content of α-SiAlON crystal in the crystalline phase was 84 mass %, the lattice constant a of the α-SiAlON was 0.7829 nm, and the lattice constant c was 0.5658 nm. The lattice constants of the α-SiAlON are identical with those of the phosphor of Example 1, indicating that the difference in acid treatment condition only leads to change in the amounts of heterogeneous phases.

The phosphor of Example 8 showed a peak wavelength of 582 nm and a relative fluorescence peak intensity of 89% in the fluorescence spectrum, when excited by a light having a wavelength of 455 nm. The phosphor of the Example 8 contained smaller amounts of heterogeneous phases than the phosphor of Example 1 and thus showed a slightly lower fluorescence intensity.

The results above are summarized in the following Table 1.

TABLE 1

| | Lattice constant (nm) | | Oxygen content | Eu content | α-SiAlON crystal content | Peak wavelength | Relative fluorescence peak intensity (%) |
|---|---|---|---|---|---|---|---|
| | a | c | (mass %) | (mass %) | (mass %) | (nm) | |
| Example 1 | 0.7829 | 0.5658 | 0.74 | 0.63 | 100 | 582 | 100 |
| Example 2 | 0.7828 | 0.5657 | 0.54 | 0.68 | 97 | 583 | 97 |
| Example 3 | 0.7833 | 0.5660 | 0.68 | 1.18 | 97 | 586 | 94 |
| Example 4 | 0.7824 | 0.5656 | 0.70 | 0.53 | 97 | 581 | 93 |
| Example 5 | 0.7831 | 0.5663 | 1.13 | 0.42 | 98 | 583 | 89 |
| Example 6 | 0.7822 | 0.5660 | 0.77 | 0.55 | 94 | 582 | 92 |
| Example 7 | 0.7834 | 0.5666 | 0.68 | 0.65 | 100 | 587 | 95 |
| Example 8 | 0.7829 | 0.5658 | 0.89 | 0.74 | 84 | 582 | 89 |
| Comparative | 0.7811 | 0.5674 | 5.84 | 0.77 | 100 | 565 | 36 |

TABLE 1-continued

| | Lattice constant (nm) | | Oxygen content (mass %) | Eu content (mass %) | α-SiAlON crystal content (mass %) | Peak wavelength (nm) | Relative fluorescence peak intensity (%) |
|---|---|---|---|---|---|---|---|
| | a | c | | | | | |
| Example 1 | | | | | | | |
| Comparative Example 2 | 0.7813 | 0.5652 | 0.67 | 0.53 | 98 | 579 | 59 |
| Comparative Example 3 | 0.7825 | 0.5662 | 1.27 | 1.02 | 100 | 583 | 49 |
| Comparative Example 4 | 0.7830 | 0.5658 | 1.05 | 1.63 | 97 | 598 | 32 |

As shown in Table 1 above, the phosphor of Comparative Example 1 showed blueshift of the fluorescence peak wavelength, compared to the phosphor of Example 1, and also gave a significantly lower fluorescence peak intensity. The phosphor of Comparative Example 2 had a small lattice constant a, showed blueshift of the fluorescence peak wavelength, and also gave a smaller fluorescence peak intensity. The phosphor of Comparative Example 3 had an oxygen content larger than the range of the present invention and gave a smaller fluorescence peak intensity. The phosphor of Comparative Example 4 had an Eu content larger than the range of the present invention, showed red shift of the fluorescence peak wavelength and gave a significantly lower fluorescence peak intensity.

In contrast, the phosphors of Examples 1 to 8 gave a fluorescence peak at a wavelength in the range of 580 to 595 nm and also gave a larger peak intensity. The results above show that it is possible according to the present invention to obtain a phosphor superior in luminous efficiency.

Example 9 and Comparative Example 5

A white LED emitting white light was prepared with the phosphor of Example 2 as the light-emitting element of Example 9. Specifically, the phosphor of Example 2 and a green β-SiAlON phosphor for adjustment of chromaticity (GR-545K produced by DENKI KAGAKU KOGYO KABUSHIKI KAISHA) were added to a silicone resin and the mixture was defoamed and kneaded. The mixture was applied onto the light-emitting face of a blue LED element having a peak wavelength of 450 nm, to give a white LED. The chromaticity of the white LED was controlled in the range corresponding to the color of electric lamp, as specified in the light source color classification of JIS Z9112, by adjustment of the amounts of the two kinds of phosphors added to the silicone resin.

An electric lamp-color LED was prepared by a method similar to Example 9, except that the phosphor of Comparative Example 3 that gives the peak wavelength identical with the phosphor of Example 2 was used as the light-emitting element of Comparative Example 5.

The emission characteristics of the light-emitting elements of Example 9 and Comparative Example 5 were determined under the same condition on an emission spectrum analyzer MCPD7000 of Otsuka Electronics Co., Ltd. The measurement was carried out with multiple LEDs at a certain chromaticity and the average of the light intensities of five LEDs having a deviation (Δuv) in the range of ±0.01 at a correlated color temperature of 2800 to 2900K was compared. As a result, the light-emitting element of Example 9 was found to have a light intensity of 145%, as compared to 100% of the light intensity of the light-emitting element of Comparative Example 5.

Example 10 and Comparative Example 6

The lighting device of Example 10 was prepared, using the light-emitting element of Example 9 (white LED). The lighting device of Comparative Example 6 was prepared, using the light-emitting element of Comparative Example 5 (electric lamp-color LED). The lighting device of Example 10 gave a light intensity higher than that of the lighting device of Comparative Example 6.

The invention claimed is:

1. A phosphor of an Eu-activated Li-solid-solubilized α-SiAlON having a lattice constant a of 0.7820 to 0.7835 nm, a lattice constant c of 0.5645 to 0.5670 nm, an oxygen content of 0.4 to 1.2 mass %, and an europium (Eu) content of 0.3 to 1.2 mass %, emitting a light having a peak wavelength of 580 to 595 nm in the fluorescence spectrum when excited by a monochromatic light having a peak wavelength in the range of 450 to 460 nm.

2. The phosphor according to claim 1, wherein part of Li is replaced with one or more elements selected from the group consisting of Mg, Ca, Y, and lanthanoids (however, excluding La, Ce, and Eu), as the electrical neutrality thereof is preserved.

3. The phosphor according to claim 1, wherein the content of the α-SiAlON crystal in the entire crystalline phase is 90 mass % or more.

4. A light-emitting element, comprising the phosphor according to claim 1 and a light source irradiating excitation light to the phosphor.

5. The light-emitting element according to claim 4, wherein the light source is a light-emitting diode or a laser diode having a peak emission wavelength of 240 to 480 nm.

6. A lighting apparatus, comprising the light-emitting element according to claim 4.

* * * * *